(12) United States Patent
Bhamidipati et al.

(10) Patent No.: US 10,746,794 B2
(45) Date of Patent: Aug. 18, 2020

(54) LOGIC BUILT IN SELF TEST CIRCUITRY FOR USE IN AN INTEGRATED CIRCUIT WITH SCAN CHAINS

(71) Applicant: International Business Machines Corporation, Armonk, NY (US)

(72) Inventors: Satya R. S. Bhamidipati, Akividu (IN); Raghu G. Gopalakrishnasetty, Bangalore (IN); Mary P. Kusko, Poughkeepsie, NY (US); Cedric Lichtenau, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 598 days.

(21) Appl. No.: 15/180,281

(22) Filed: Jun. 13, 2016

(65) Prior Publication Data

US 2017/0192057 A1 Jul. 6, 2017

Related U.S. Application Data

(63) Continuation of application No. 14/987,945, filed on Jan. 5, 2016.

(51) Int. Cl.
*G01R 31/317* (2006.01)
*G01R 31/3185* (2006.01)

(52) U.S. Cl.
CPC . *G01R 31/31727* (2013.01); *G01R 31/31724* (2013.01); *G01R 31/318547* (2013.01)

(58) Field of Classification Search
CPC .... G01R 31/318555; G01R 31/318572; G01R 31/318541; G01R 31/318536;

(Continued)

(56) References Cited

U.S. PATENT DOCUMENTS 5,661,732 A    8/1997   Lo et al.
6,115,763 A *   9/2000   Douskey ............... G06F 11/267
                                                                 710/20

(Continued)

FOREIGN PATENT DOCUMENTS

WO      2011116116 A2    9/2011

OTHER PUBLICATIONS

Bhamidipati et al., U.S. Appl. No. 14/987,848 entitled "Logic Built in Self Test Circuitry for Use in an Integrated Circuit With Scan Chains," filed on Jan. 5, 2016.

(Continued)

*Primary Examiner* — Albert Decady
*Assistant Examiner* — Enam Ahmed
(74) *Attorney, Agent, or Firm* — Cantor Colburn LLP; Margaret McNamara

(57) ABSTRACT

Aspects include a method for logic built-in self-testing (LBIST) for use in an integrated circuit with scan chains. The method includes programming a product control generator and a pattern generator with an LBIST pattern comprising at least a number of loops. The LBIST pattern is executed by generating scan-in test values for scan chains with the pattern generator and controlling at least one test parameter with the product control generator. Scan-out responses are collected from the scan chains in a signature register, and a start request is received from a chip tester. The LBIST is started in response to the start request. Test summary data is reported to the chip tester before the whole number of loops has been executed.

8 Claims, 8 Drawing Sheets

(58) Field of Classification Search
CPC ...... G01R 31/31727; G01R 31/318547; G01R 31/31724; H05K 999/99
USPC ...................................................... 714/727
See application file for complete search history.

(56) References Cited

U.S. PATENT DOCUMENTS

| | | | |
|---|---|---|---|
| 6,553,527 B1 | 4/2003 | Shephard, III | |
| 6,651,202 B1 | 11/2003 | Phan | |
| 6,671,838 B1 | 12/2003 | Koprowski et al. | |
| 6,701,476 B2* | 3/2004 | Pouya | G01R 31/318385 714/727 |
| 6,886,090 B1* | 4/2005 | Campbell | G06F 12/1027 345/568 |
| 6,981,191 B2 | 12/2005 | Dorsey | |
| 7,266,745 B2 | 9/2007 | Kiryu | |
| 7,490,280 B2 | 2/2009 | Grise et al. | |
| 7,519,880 B1 | 4/2009 | Johnson et al. | |
| 7,519,889 B1* | 4/2009 | Cervantes | G01R 31/318385 714/25 |
| 7,627,798 B2* | 12/2009 | Kiryu | G01R 31/3187 714/30 |
| 7,665,002 B1 | 2/2010 | White et al. | |
| 7,840,865 B2* | 11/2010 | Lai | G01R 31/318547 714/728 |
| 7,844,869 B2 | 11/2010 | Bushard et al. | |
| 7,934,134 B2* | 4/2011 | Forlenza | G01R 31/318533 714/726 |
| 8,006,153 B2 | 8/2011 | Ferguson et al. | |
| 8,205,124 B2 | 6/2012 | Grise et al. | |
| 8,275,979 B2 | 9/2012 | Nicklaus et al. | |
| 8,281,279 B2* | 10/2012 | Maloney | G06F 30/327 716/136 |
| 8,402,003 B2* | 3/2013 | Biran | G06F 16/90344 707/688 |
| 8,423,847 B2 | 4/2013 | Grise et al. | |
| 8,461,865 B2 | 6/2013 | Schlagenhaft | |
| 8,689,066 B2 | 4/2014 | Grady et al. | |
| 8,700,962 B2 | 4/2014 | Tekumalla et al. | |
| 8,799,713 B2 | 8/2014 | Gangasani et al. | |
| 8,883,973 B2 | 11/2014 | Chamberlain et al. | |
| 8,943,377 B2 | 1/2015 | Harper et al. | |
| 9,404,969 B1* | 8/2016 | Keller | G01R 31/31703 |
| 9,448,282 B1 | 9/2016 | Meehl | |
| 9,632,140 B2 | 4/2017 | Kulkarni et al. | |
| 9,797,950 B2 | 10/2017 | Nishikawa | |
| 10,459,031 B2 | 10/2019 | Gloekler et al. | |
| 2002/0083386 A1* | 6/2002 | McCauley | G01R 31/318385 714/726 |
| 2002/0125907 A1* | 9/2002 | Kurtulik | G01R 31/3185 324/750.3 |
| 2003/0145263 A1* | 7/2003 | Song | G01R 31/31707 714/726 |
| 2004/0230882 A1 | 11/2004 | Huott et al. | |
| 2005/0160339 A1* | 7/2005 | Forlenza | G01R 31/318371 714/733 |
| 2006/0064265 A1 | 3/2006 | Kiryu | |
| 2007/0266284 A1* | 11/2007 | Chelstrom | G01R 31/318558 714/727 |
| 2007/0273401 A1 | 11/2007 | Kiryu | |
| 2008/0082887 A1 | 4/2008 | Dhong et al. | |
| 2008/0276144 A1* | 11/2008 | Huben | G01R 31/318385 714/733 |
| 2009/0210763 A1* | 8/2009 | Eckelman | G01R 31/318536 714/731 |
| 2009/0217116 A1* | 8/2009 | Motika | G01R 31/318536 714/729 |
| 2009/0254788 A1 | 10/2009 | Cervantes et al. | |
| 2009/0327824 A1 | 12/2009 | Alaniz et al. | |
| 2010/0115337 A1 | 5/2010 | Forlenza et al. | |
| 2010/0262879 A1* | 10/2010 | Floyd | G01R 31/31724 714/733 |
| 2011/0231719 A1 | 9/2011 | Kim et al. | |
| 2011/0258499 A1 | 10/2011 | Casarsa | |
| 2012/0189274 A1 | 7/2012 | Toma et al. | |
| 2014/0149814 A1 | 5/2014 | Al-Omari | |
| 2014/0258798 A1 | 9/2014 | Ahmed et al. | |
| 2014/0310565 A1* | 10/2014 | Bhagat | G01R 31/318547 714/727 |
| 2014/0359386 A1 | 12/2014 | Gorti et al. | |
| 2014/0365840 A1* | 12/2014 | Lin | G01R 31/318547 714/727 |
| 2015/0113346 A1* | 4/2015 | Gloekler | G01R 31/318544 714/727 |
| 2015/0262706 A1* | 9/2015 | Curley | G11C 29/18 714/42 |
| 2016/0003900 A1 | 1/2016 | Narayanan et al. | |
| 2017/0192054 A1 | 7/2017 | Bhamidipati et al. | |
| 2017/0192055 A1 | 7/2017 | Bhamidipati et al. | |

OTHER PUBLICATIONS

Bhamidipati et al., U.S. Appl. No. 14/987,945 entitled "Logic Built in Self Test Circuitry for Use in an Integrated Circuit With Scan Chains," filed on Jan. 5, 2016.
List of IBM Patents or Patent Applictions Treated As Related; (Appendix P), Filed Jun. 13, 2016, 2 pages.
Bhamidipati et al.; "Logic Built in Self Test Circuitry for Use in an Integrated Circuit With Scan Chains"; U.S. Appl. No. 16/017,188, filed Jun. 25, 2018.
List of IBM Patents or Patent Applications Treated As Related; Date Filed: Jun. 25, 2018, 2 pages.
Al-Yamani et al.; "BIST Reseeding With Very Few Seeds"; Proceedings of the 21st IEEE VLSI Test Symposium (2003); 6 pages.
Bushard et al.; "Testing Challenges of a Multicore Microprocessor"; Evaluation Engineering; Feb. 1, 2007; 9 pages <https://www.evaluationengineering.com/testing-challenges-of-a-multicore-microprocessor.php>.
Hakmi et al.; "Programmable Deterministic Built-in Self-test"; IEEE International Test Conference (2007); 9 pages.
Huang et al., "Programmable Logic Bist for At-Speed Test," Mentor Graphics Corp., Oct. 2007; 6 pages.
Kalligeros et al.; "Multiphase BIST: A New Reseeding Technique for High Test-Data Compression"; IEEE Transactions on Computer-Aided Design of Integrated Circuits and Systems, vol. 23, No. 10; Oct. 2004; 18 pages.
Kiefer et al.; "Using BIST Control for Pattern Generation"; IEEE International Test Conference (1997), Paper 14.3; 9 pages.
Prabhu et al., "A Diagnosis-Friendly LBIST Architecture With Property Checking," IEEE, International Test Conference, Paper 29.2; Oct. 2014; 9 pages.
Lai et al., "Programmable Scan-Based Logic Built-In Self Test," 16th IEEE Asian Test Symposium, Mentor Graphics corporation, 2007, 7 pages.

* cited by examiner

LOGIC BUILT IN SELF TEST CIRCUITRY FOR USE IN AN INTEGRATED CIRCUIT WITH SCAN CHAINS

DOMESTIC PRIORITY

This application is a continuation application of the legally related U.S. Ser. No. 14/987,945, filed Jan. 5, 2016, the contents of which are incorporated by reference herein in their entirety.

BACKGROUND

The present invention generally relates to testing integrated circuits and, more specifically, to logic built-in self-test (LBIST) circuitry for use in an integrated circuit with scan chains.

Digital integrated circuits are used for a diverse number of electronic applications, from simple devices such as wristwatches to the most complex computer systems. Defects in digital integrated circuits may occur.

"Stored patterns" was one of the first methods developed for testing digital integrated devices for defects. According to the stored patterns method, a value per latch of the device under test (DUT) is defined, and this data is stored in a chip tester and applied upon pattern execution. Similarly, a clock or capture sequence may be stored. After the functional clock sequence execution, the chip tester receives the measured values per latch and compares them with the expected values to determine defects in the DUT. The stored patterns method requires access of the chip tester to each latch to be tested of the DUT. With millions of latches on a chip this becomes a very time-consuming operation.

LBIST has become a popular technique for on-chip testing of digital integrated circuits. LBIST offers a number of benefits targeted at the reduction of test time.

The scannable latches of the DUT may be broken into short scan chains and the major components of LBIST circuitry include a pattern generator, a signature register and an on-product test control generator.

The pattern generator is initialized with a seed and provides scan-in values to the scan chains. A clocking sequence is applied on the DUT and the signature register collects scan-out responses from the scan chains.

The chip tester only needs to store an LBIST setup that includes the seed, the loop count, and the clock sequence. As the scan-in values are generated on the DUT at higher speeds compared to the tester communication speed, the time necessary per loop is significantly reduced.

As technology advances, the number of transistors on a chip increases and the number of defects during manufacturing may increase, in particular when a new manufacturing process is introduced. Moreover, said defects may be difficult to detect. Accordingly, more thorough testing may be required, which consumes more time and augments the test time.

SUMMARY

Embodiments include a method, system, and computer program product for logic built-in self-testing (LBIST). A method includes programming a product control generator and a pattern generator with an LBIST pattern comprising at least a number of loops. The LBIST pattern is executed by generating scan-in test values for scan chains with the pattern generator and controlling at least one test parameter with the product control generator. Scan-out responses are collected from the scan chains in a signature register, and a start request is received from a chip tester. The LBIST is started in response to the start request. Test summary data is reported to the chip tester before the whole number of loops has been executed.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments of the present invention may be better understood, and its numerous objects, features, and advantages made apparent to those skilled in the art by referencing the accompanying drawings.

Figure 1:
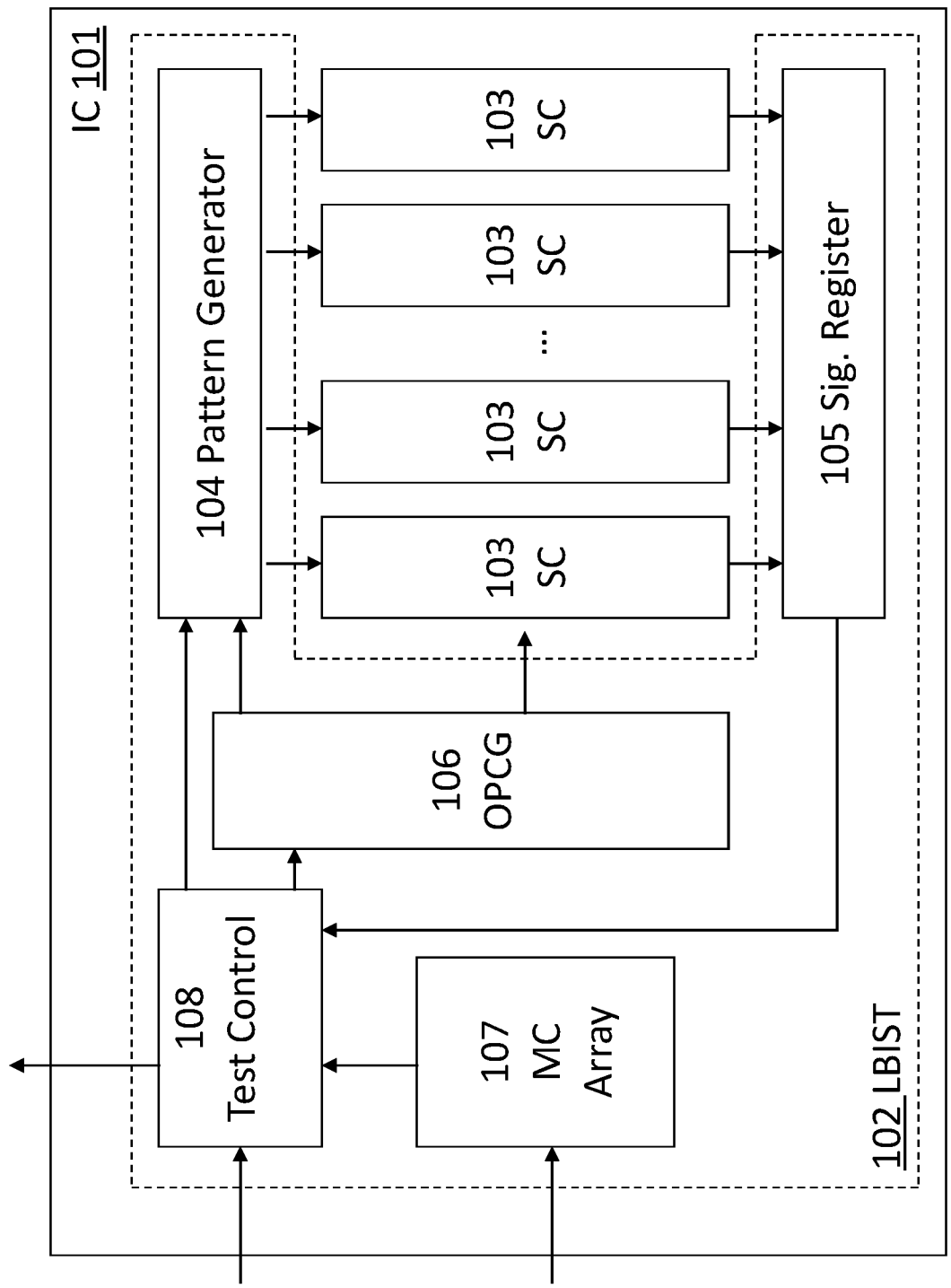
FIG. 1 shows an integrated circuit that includes logic built-in self-test (LBIST) circuitry in accordance with some embodiments of this disclosure.

The embodiment shown in FIG. 1 discloses an integrated circuit 101 comprising logic built-in self-test (LBIST) circuitry 102 and scan chains 103. The LBIST circuitry 102 includes a pattern generator 104, a signature register 105 and an on-product control generation 106.

The pattern generator 104 is adapted to generate scan-in values for the scan chains 103 and the multi input register 105 to collect scan-out responses from the scan chains 103. The on-product control generation 106 provides the necessary control for steering the pattern generator 104, the scan chains 103 and the signature register 105 as well as driving the clock sequence to the functional logic.

Moreover, the LBIST circuitry comprises a microcode array 107 with inputs to initialize its fields. Test control means 108 (or test controller) comprise reading means (or reader) (not shown) to read test parameters from a field of the microcode array 107. Furthermore, the test control means 108 include programming means (not shown) responsive to the reading means to configure the pattern generator 104 and the product control generation 106 with the read test parameters.

The test parameters may include a type of clock sequence, a number of loops, a scan clock rate and a weight.

Typically, the probability that a binary scan-in value generated by the pattern generator is "0" will be ½. Applying a weight to the pattern generator may change the probability to $\frac{1}{8}$, $\frac{7}{8}$, $\frac{1}{16}$, $\frac{15}{16}$, $\frac{1}{32}$, $\frac{31}{32}$, $\frac{1}{64}$ or $\frac{63}{64}$, respectively. This may enhance the chance to detect a particular defect in the DUT an AND or OR gate having a large number of inputs.

Clocking sequence may include a launch-off clock and/or a launch-off scan. A launch-off clock may be used primarily to detect DC defects. A launch-off scan may be used primarily to detect AC defects. Furthermore, defects may only show up at a specific scan clock rate or with a specific clock sequence.

Performing several loops with the same weight, the same type of clock sequence and the same clock rate may increase test coverage at limited increased test time as the setup is only necessary once.

A set of test parameters to be applied to the DUT, i.e. the pattern generator 104 and the on-product control generation 106, may also be called an LBIST pattern.

From the fields of the microcode array 107 several different LBIST patterns may be derived. The test control means (or test controller) may apply these LBIST patterns on the DUT in the stored sequence or in a random order.

Each design of an integrated circuit may have its particular design for test (DFT) requirements. The disclosed LBIST circuitry may support executing LBIST patterns with different variations in view of the particular DFT requirements.

The described LBIST circuitry has to be initialized only once by the chip tester before performing the LBIST. In particular, only the fields of the microcode array 107 have to be initialized. Thereafter, the different LBIST patterns may be executed automatically. Hence, considerable chip tester time may be saved compared to conventional LBIST circuitry, where every LBIST pattern has to be initialized separately by the chip tester.

For example, if DFT requires three different clock sequences and four different weights to achieve the target test coverage. The test control means 108 of the LBIST circuitry would sequence through and execute all twelve combinations and weights with only one initialization of the LBIST circuitry by initializing the fields of the microcode array. Moreover, only one value from the signature register may be required to determine, whether the LBIST circuitry passed the test trough all said twelve LBIST patterns or if it failed.

Figure 2:
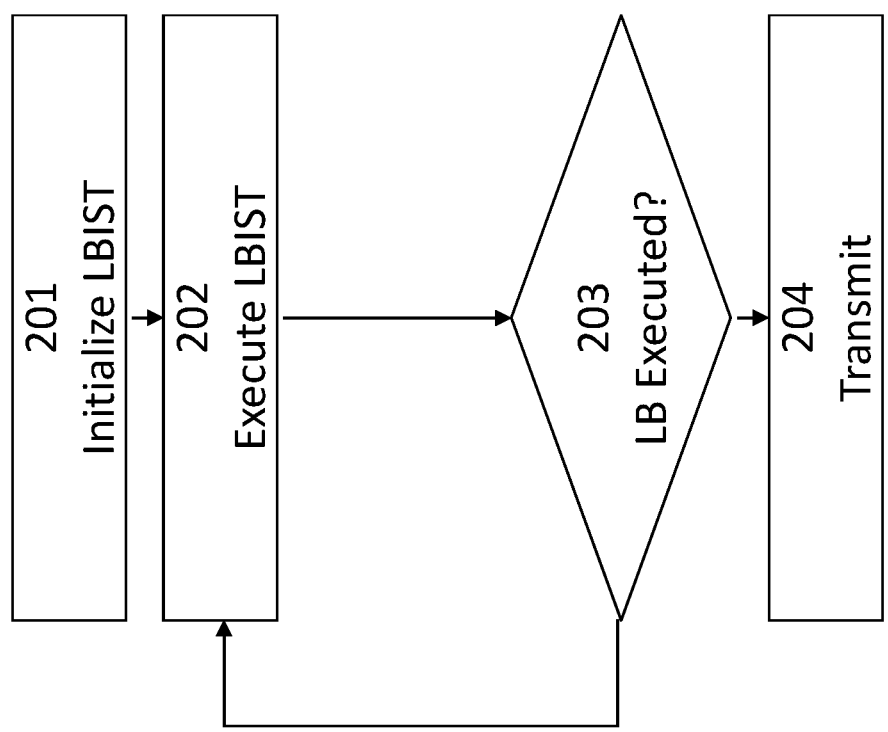
FIG. 2 is a flow chart illustrating a LBIST method in accordance with some embodiments of this disclosure.

A LBIST method like that shown in the embodiment of FIG. 2 may be described with reference to FIG. 1. In a first step 201, the chip tester initializes the LBIST circuitry with a setup for a number of LBIST patterns. A first LBIST pattern is executed according to the second step 202. After the execution step 202 it is determined, whether all LBIST patterns have been executed (step 203). If not, the next LBIST pattern is executed pursuant to step 202. After all LBIST patterns have been executed the final values in the signature register are transmitted to the chip tester for evaluation (step 204).

Figure 3:
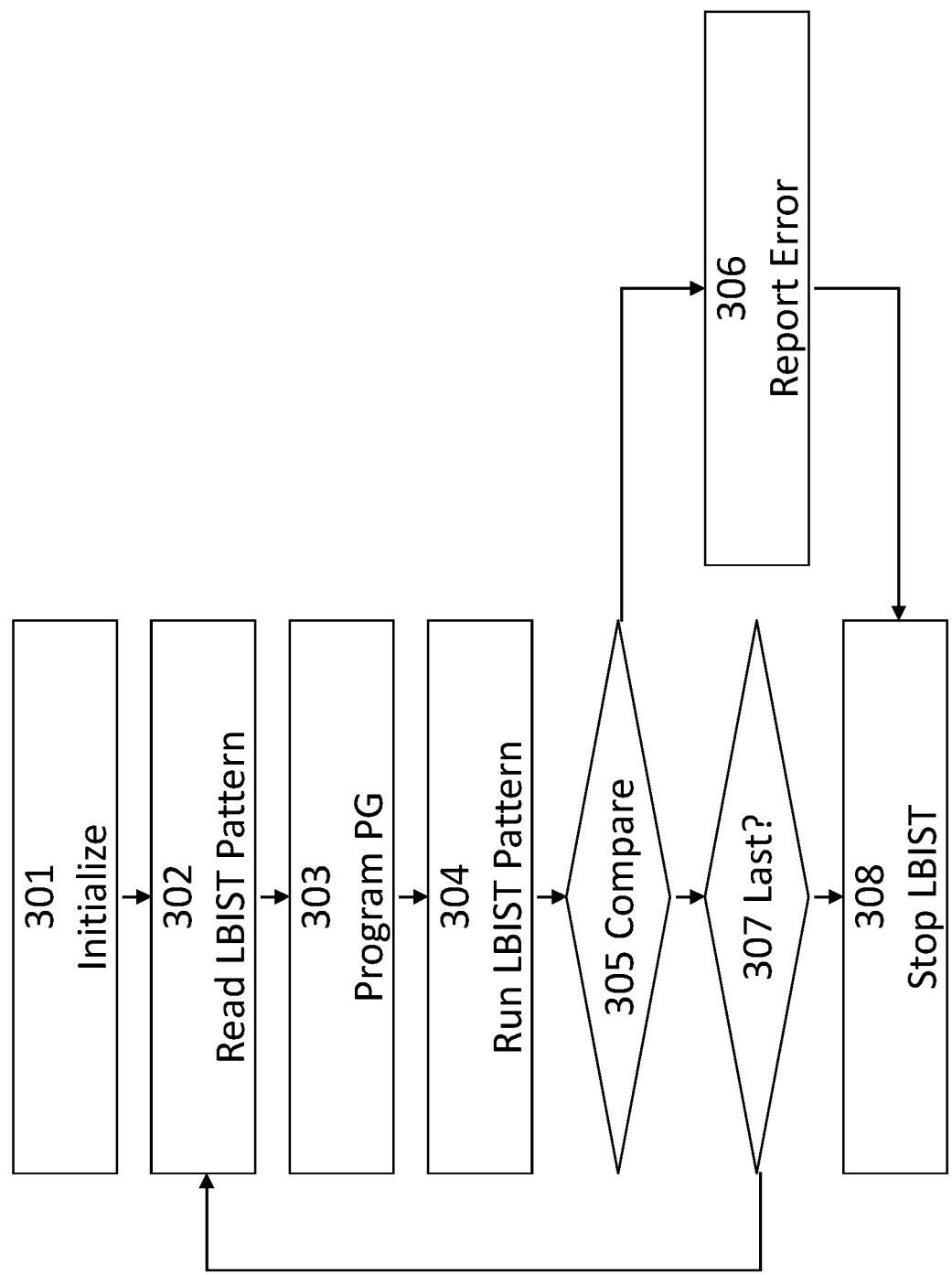
FIG. 3 is a flow chart illustrating another LBIST method in accordance with some embodiments of this disclosure.

FIG. 3 shows another embodiment of a LBIST method. First, the chip tester initializes the fields of the microcode array and transmits a starting signal to the LBIST circuitry (301). Thereafter, an LBIST pattern is read from fields of the micro array (302) and the on-product control generation and a pattern generator is programmed according to the LBIST pattern (303). After running the LBIST pattern (304), collected scan-out responses from scan chains of the integrated circuit are compared with the expected data (305). If there is no agreement, the LBIST circuitry reports an error to the chip tester (306) and the LBIST is stopped (308). In case no error is detected, it is determined whether the executed LBIST pattern has been the last one (307). If true, the LBIST is stopped (308). If false, the next LBIST pattern is read from fields of the micro array (302).

Figure 4:
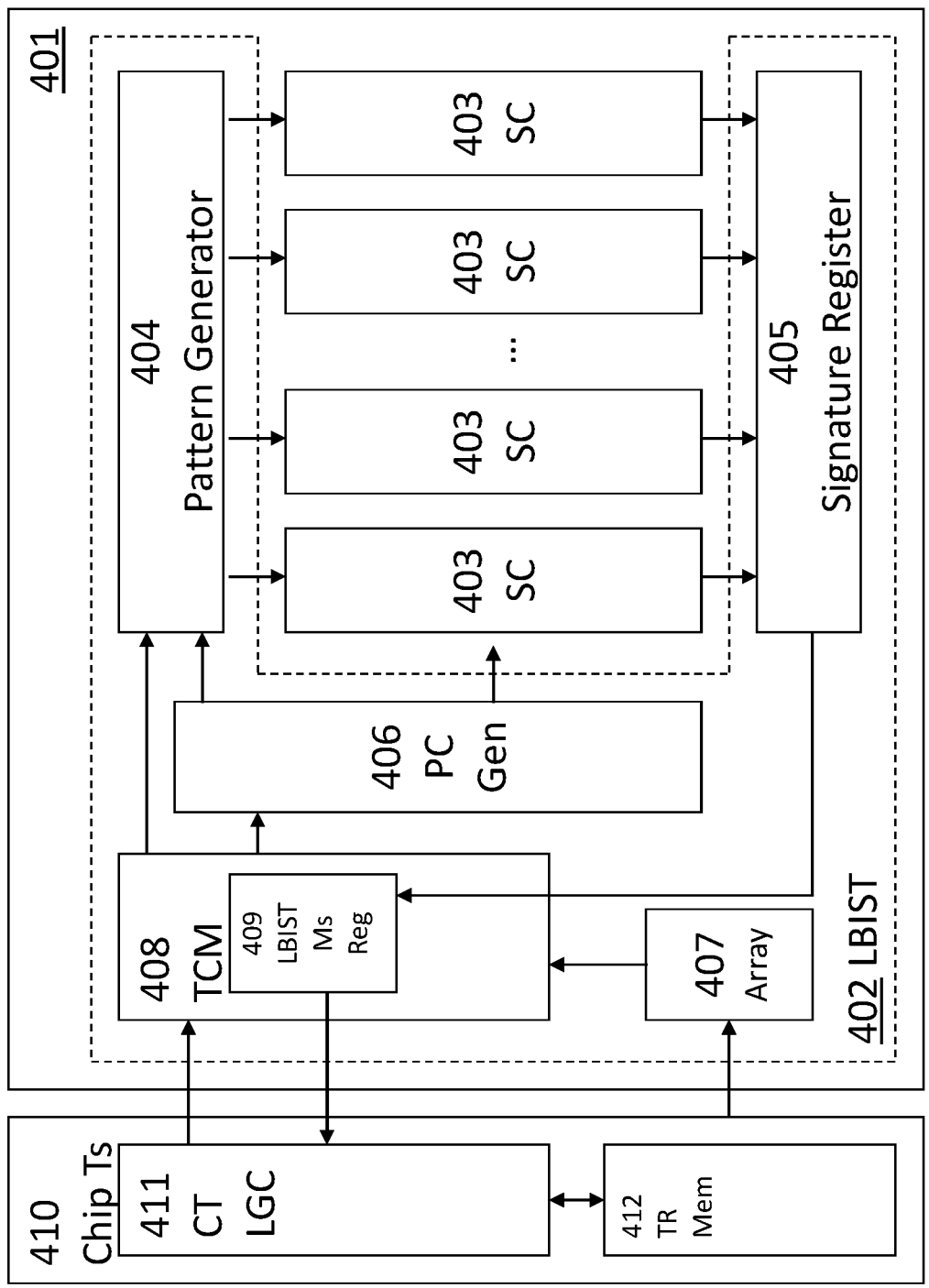
FIG. 4 shows a further integrated circuit comprising LBIST circuitry and a chip tester in accordance with some embodiments of this disclosure.

FIG. 4 shows another embodiment of an integrated circuit 401 with scan chains 403 and LBIST circuitry 402. The LBIST circuitry 402 comprises a pattern generator 404, a signature register 405 and an on-product control generation 406.

The pattern generator 404 may be configured for generating scan-in values for the scan chains 403. The signature register 405 receives the scan-out responses from the scan chains 403. The product control generation 406 controls the steering for driving the pattern generator 404, the scan chains 403, and the signature register 405 as well as driving the clock sequence to the functional logic to be tested.

Furthermore, the LBIST circuitry comprises a microcode array 407 including inputs for initializing the fields of the microcode array 407. Additionally, test control means 408 with reading means (not shown) and programming means (or programming component) (not shown) are provided. The reading means are adapted to read test parameters from fields of the microcode array 407 and the programming means are configured to program the pattern generator 404 and the product control generation 406 with the read test parameters. The test control means also include an LBIST measure register 409 for temporarily storing the LBIST measure values of the signature register 405 and a flag indicating that an LBIST pattern has been completely executed.

Moreover, a chip tester 410 is depicted in FIG. 4 in schematic form. The chip tester 410 comprises a chip tester logic 411 and an expected test result memory 412. The chip tester logic 411 may be adapted to start the LBIST of the integrated circuit 401, i.e. the device under test (DUT). The chip tester logic may determine whether a flag in the LBIST measure register 409 has been set indicating that an LBIST pattern has been completely executed has been set and, depending on the result, to download or read the LBIST measure values from the LBIST measure register. The downloaded or read LBIST measure values may then be compared with the expected LBIST values for the specific LBIST pattern, which are stored in the expected test result memory 412.

Figure 5:
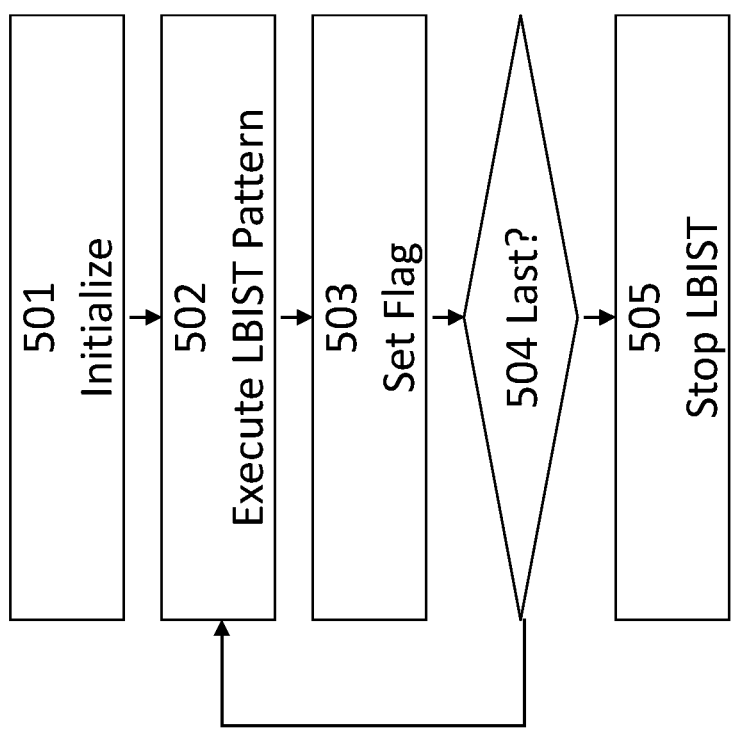
FIG. 5 is a flow chart illustrating an additional LBIST method in accordance with some embodiments of this disclosure.

A still further embodiment of a LBIST method may be explained with reference to FIG. 5. As has been described hereinbefore, the method starts with initializing the fields of a microcode array of the LBIST circuitry (501). Thereafter, a first LBIST pattern is executed (502), the LBIST measure values obtained by the signature register are transmitted into an LBIST measure register of the test control means, and sets a flag in the LBIST measure register indicating that the LBIST pattern has been executed (503). Additionally, information indicative of the applied LBIST pattern (number of clocks, type of clock sequence, weight) may be stored in the LBIST measure register to allow direct matching between these parameters and the signature by the tester. This allows to swap the sequence of tests without needed new tester compare sequence. Swapping the sequence of tests is useful to have the test with the highest fall out statistical rate first to reduce test time. If it is determined in step 504 that the executed LBIST pattern was the last one, the LBIST is stopped (505). Otherwise, the steps 502 to 504 are repeated.

Figure 6:
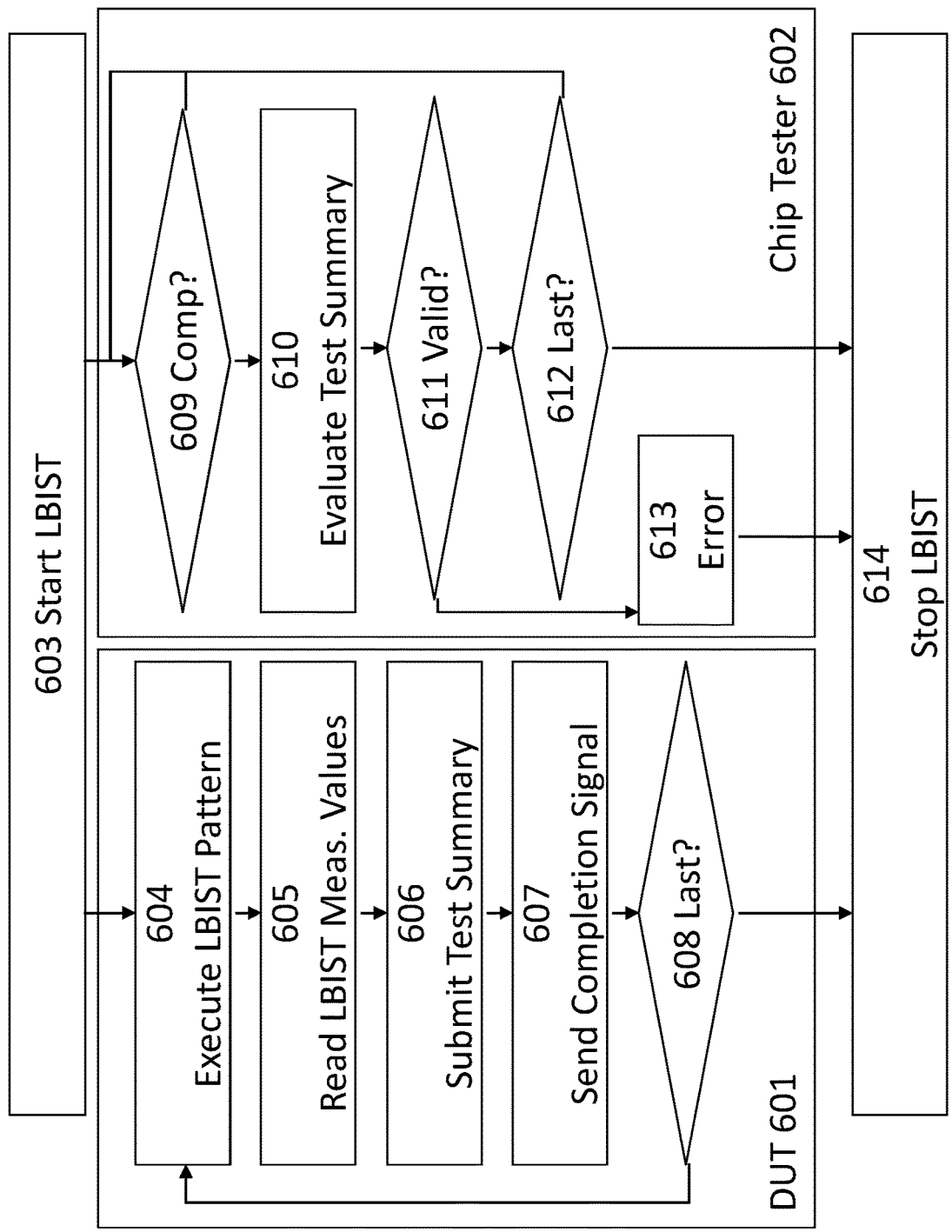
FIG. 6 is a flow chart illustrating a LBIST method with communication with a tester (ATE) in accordance with some embodiments of this disclosure.

The interaction of a chip tester 602 and a DUT 601, the microcode of which has been initialized before, may be explained with reference to the embodiment shown in FIG. 6. After starting of the LBIST in step 603, the DUT executes an LBIST pattern (604), reads the LBIST measure values from the signature register (605) and submits a test summary to the chip tester via output pins (606). Upon completion of the submission, the DUT sends a completion signal to the chip tester (607). These steps are repeated until it is determined that the last LBIST pattern has been applied in step 608 and the LBIST is stopped (614).

The chip tester repeatedly determines whether a completion signal has been received (609). Upon reception of such a signal, the test summary is evaluated (610). If it is detected that the test summary is valid (611), i.e. the test summary corresponds to the expected result, it is determined whether it has been the last LBIST pattern (612). If this is the case, the chip tester stops testing (614). Otherwise, steps 609 to 612 are repeated.

If the test summary does not correspond to the expected result in step 611, the chip tester outputs and error signal or flag (613) and stops testing as well (614).

Figure 7:
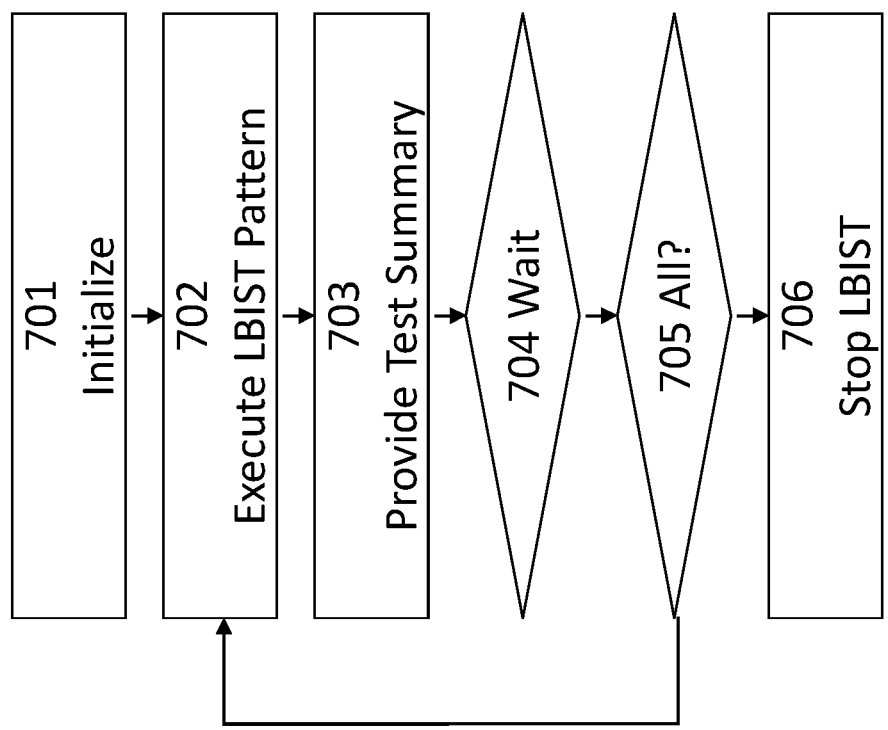
FIG. 7 illustrates another LBIST method with communication with ATE in accordance with some embodiments of this disclosure.

FIG. 7 shows another embodiment of a LBIST method. As has been explained hereinbefore, the microcode array is initialized and the LBIST is started in a first step 701. Thereafter, in step 702, a first LBIST pattern is executed. A test summary derived from the scan-out values collected by the signature register is provided for a chip tester, which may also be called automatic test equipment (ATE), in step 703. In step 704, the LBIST circuitry waits for the ATE to submit a continue signal. Upon receipt of the continue signal the LBIST circuitry determines in step 705, whether all LBIST patterns have been executed. If not, the preceding steps 702 to 705 repeated. Otherwise, the LBIST is stopped (706).

Figure 8:
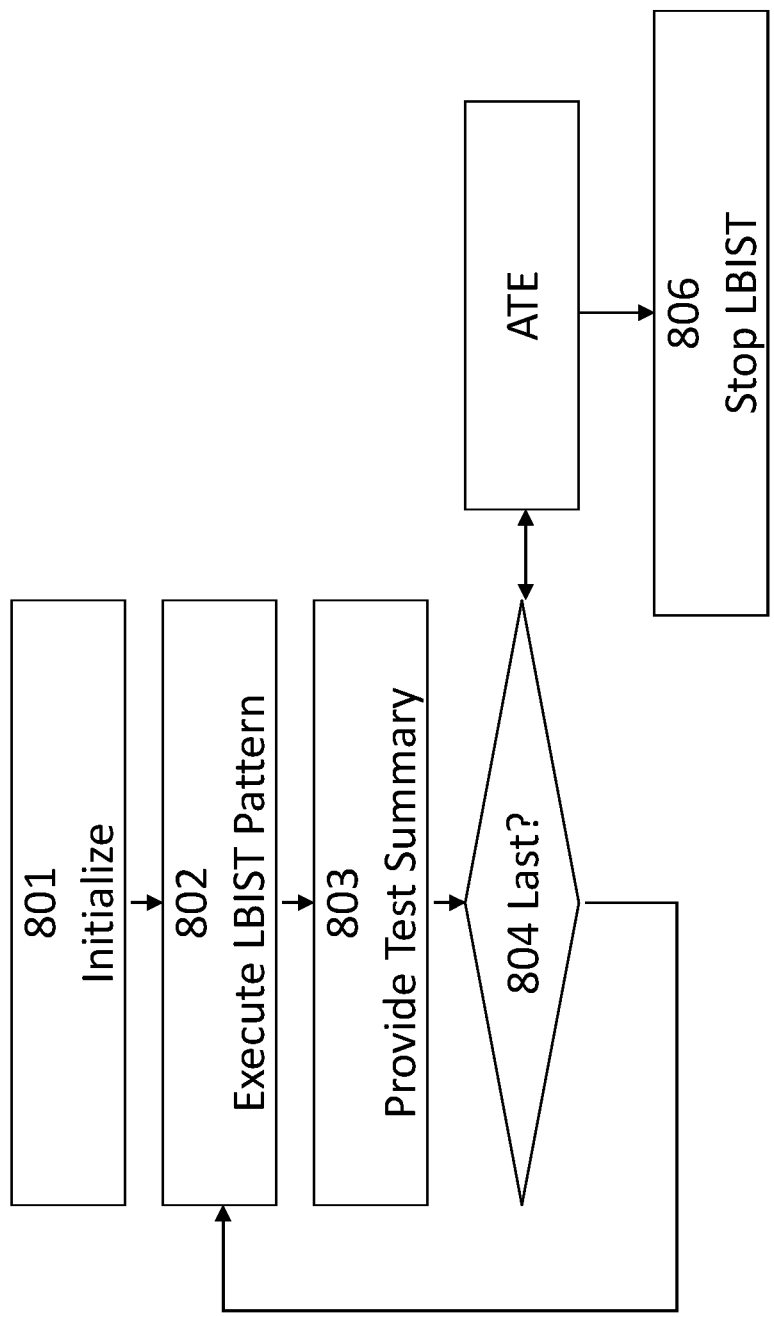
FIG. 8 shows a still further LBIST method with communication with ATE in accordance with some embodiments of this disclosure.

FIG. 8 illustrates a still further embodiment of a LBIST method. The LBIST method starts with initializing the microcode and starting the LBIST in step 801. Afterwards, a first LBIST pattern is executed (step 802) and the test summary derived from the scan-out values collected by the signature register is provided for the ATE (step 803). In Step 804 it is determined if this was the last pattern. If not, the steps 801 to 804 are repeated. In case the ATE determines that the provided signature is incorrect or all LBIST patterns have been executed, the ATE may stop the LBIST.

According to a first aspect, an embodiment of the invention relates to LBIST circuitry for use in an integrated circuit with scan chains, comprising (but not limited to) a pattern generator for generating scan-in test values for said scan chains; a signature register for collecting scan-out responses from said scan chains after a clock sequence; an on-product control generation to control at least one test parameter; test control means comprising: programming means to configure said on-product control generation and said pattern generation with an LBIST pattern comprising at least a number of loops; communication means to communicate with a chip tester, comprising: receiving means (or receiving component) to receive a start request from said chip tester; starting means (or starting component) responsive to said receiving means to trigger said test control means; reporting means (or reporting component) responsive to said test control means to communicate test summary data to said chip tester before the whole number of loops has been executed.

According to a second aspect, an embodiment of the invention relates to a LBIST method comprising: programming a product control generation and a pattern generator with an LBIST pattern comprising at least a number of loops; executing the LBIST pattern by generating scan-in test values for scan chains with the pattern generator and controlling at least one test parameter with the product control generation; collecting scan-out responses from the scan chains in a signature register; receiving a start request from a chip tester; starting the LBIST in response to the start request; reporting a test summary data to the chip tester before the whole number of loops has been executed.

Communicating test summary data to the chip tester before the whole number of loops has been executed may allow for a time-saving interruption of the LBIST in case a defect is detected. For a given total tester time available, this may allow for a more thorough testing of goods DUTs by faster sorting out defective DUTs.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for logic built-in self-testing (LBIST), the method comprising:
    initializing fields of a microcode array or memory elements;
    reading test parameters from a field of the microcode array or memory elements, wherein the test parameters include a weight and one or more of number of loops, clock sequence, seed, read/write the on-chip array, variables for the scan itself and masks/aperture;

programming a product control generation and a pattern generator with an LBIST pattern according to the read test parameters and in a random order;

executing the LBIST pattern by generating scan-in test values for scan chains with the pattern generator and controlling the read test parameters with the product control generator;

storing information indicative of the executed LBIST pattern in an LBIST measure register;

collecting scan-out responses from the scan chains in a signature register;

matching the information indicative of the executed LBIST pattern with the responses collected in the signature register;

receiving a start request from a chip tester;

starting the LBIST comprising at least a number of loops in response to the start request;

repeatedly reading test parameters associated with other LBIST patterns from the microcode array and programming the product control generation and the pattern generator with the other LBIST patterns in random order.

2. The method of claim 1, wherein reporting the test summary data to the chip tester includes reporting information indicative of the applied LBIST pattern.

3. The method of claim 1, further comprising:
comparing the test summary data with expected test results by a test control means.

4. The method of claim 1, further comprising:
comparing the test summary data with expected test results; and
stopping the LBIST in case of a mismatch.

5. The method of claim 1, further comprising:
receiving, by an integrated circuit, a signal for continuing the LBIST with the next LBIST pattern, in case the test summary data matches the expected test result.

6. The method of claim 1, further comprising:
performing a next LBIST with another LBIST pattern during comparing the preceding test summary data with expected test results by the chip tester.

7. The method of claim 1, further comprising:
comparing the test summary data with expected test results by the chip tester.

8. The method of claim 1, further comprising:
comparing the test summary data with expected test results by the test control means and storing a summary result on chip.

* * * * *